United States Patent [19]

Macovski

[11] Patent Number: 5,300,887
[45] Date of Patent: Apr. 5, 1994

[54] PULSED FIELD MRI SYSTEM WITH SPATIAL SELECTION

[76] Inventor: Albert Macovski, 2505 Alpine Rd., Menlo Park, Calif. 94025

[21] Appl. No.: 873,998

[22] Filed: Apr. 27, 1992

[51] Int. Cl.$^5$ .............................................. G01V 3/00
[52] U.S. Cl. ..................................... 324/309; 324/307
[58] Field of Search ............... 324/309, 300, 307, 310, 324/311, 312, 313, 314

[56] References Cited

U.S. PATENT DOCUMENTS

4,947,119  8/1990  Ugurbil et al. ...................... 324/307
5,023,554  6/1991  Cho et al. ............................ 324/309

*Primary Examiner*—Louis Arana

[57] ABSTRACT

In an MRI imaging system using a pulsed field to polarize the magnetic moments, a gradient field is applied prior to the collapse of the pulsed field. When the pulsed field turns off, the magnetic moments are spatially varying in the vicinity of the null plane of the gradient field. In one embodiment the gradient field is in quadrature with the pulsed field, enabling the imaging gradient coils to be used to provide an excited slab. In another embodiment the selection gradient field is parallel to the pulsed field and enables sharper slices by subtracting images acquired with different null planes.

14 Claims, 7 Drawing Sheets

PULSED FIELD MRI SYSTEM WITH SPATIAL SELECTION

BACKGROUND OF THE INVENTION

1. Field of the Invention

This invention relates to magnetic resonance imaging systems. In a primary application this invention involves a pulsed magnetic field used to polarize the magnetic moments of an object. As the pulsed field collapses, a selection gradient is used to cause the magnetic moments to vary spatially, providing slice selection.

2. Description of Prior Art

The basic concepts in magnetic resonance are described in a series of papers in the June 1980 series of the IEEE Transactions on Nuclear Science, Vol. NS-27, pp 1220–1255.

Exisiting MRI systems have a large number of theoretical and practical problems. The main magnet is a very costly item, primarily because of the very high degree of homogeniety required. Also, the radio frequency transmitter requires relatively high power, and must provide this at high uniformity. In addition, regions of inhomogeniety due to susceptibility variations can produce significant distortions. These problems were addressed in U.S. Pat. No. 5,057,776 by the same inventor. Here a pulsed magnet is used to polarize the moments, providing immunity to inhomogeniety. However, except for systems which used radio frequency excitation, this approach did not describe methods for slice selectivity. Of course 3D readouts of the entire volume can be used, but these often require some type of slab selection to avoid aliasing artifacts.

SUMMARY OF THE INVENTION

An object of this invention is to provide a method of slice selection in pulsed magnetic resonance imaging systems without r.f. excitation.

A further object of this invention is to provide NMR images of selective sections without requiring r.f. excitation.

A further object of this invention is to provide 3-dimensional images of selected slabs without causing aliasing.

Briefly, in accordance with the invention, a magnetic gradient is applied prior to the collapse of the main pulsed field. During the collapse, the magnetic moments become spatially varying in the vicinity of the null plane of the gradient field. When the gradient field is normal to the pulsed field a slab surrounding the null plane has its moments parallel to the pulsed field and therefore precesses. When the gradient field is parallel to the pulsed field the magnetic moments on either side of the null plane precess in opposite directions. Subtracting excitations with different null planes provides the desired slice.

BRIEF DESCRIPTION OF THE DRAWINGS

For a more complete description of the invention reference can be made to the following detailed description of several embodiments thereof which is given in conjunction with the accompanying drawings of which.

DESCRIPTION OF THE PREFERRED EMBODIMENT

Figure 1:
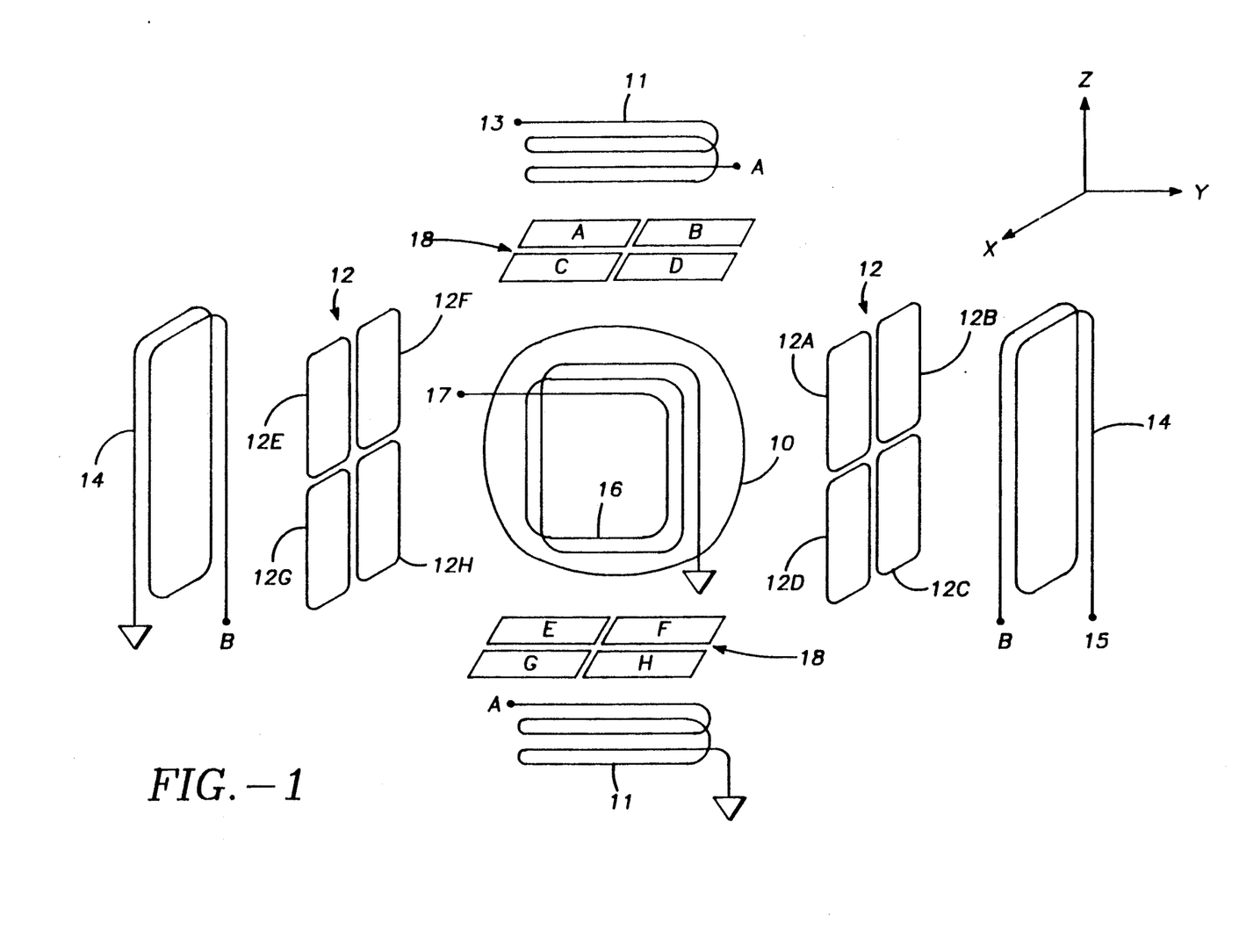
FIG. 1 is a schematic drawing illustrating an embodiment of the invention.

An understanding of the broad aspects of the invention can best be had by reference to FIG. 1. Here we basically see the pulsed MRI system first described in U.S. Pat. No. 5,057,776. The pulsed field created by coils 11, connected by terminals A, is used to polarize the magnetic moments in object 10, usually a portion of the human anatomy. A bias field generated by coils 14, connected by terminals B, can be used to enable the moments to precess about its axis. A set of gradients 12 provide fields pointed normal to the precessing moments. These are made spatially varying to provide imaging information while the moments are precessing. Using the eight coils, variations can be made in the x, y, or z axes representing the three gradient fields, all pointing in the y direction. For example, to create a y gradient coils ABCD and EFGH are driven out of phase. Similarly for a z gradient coils ABEF and CDGH are driven out of phase, and coils ADEG and BCFH are driven out of phase for an x gradient. These provide gradient fields as given by:

$$G_x = d/dx\, B_y$$

$$G_y = d/dy\, B_y$$

$$G_z = d/dz\, B_y.$$

These gradient fields are used following the polarizing pulse, while the moments are precessing, to create linear space-varying fields to provide imaging. If a two-dimensional slice is selected, only the two gradient fields in the plane of the slice are required to make an image of the slice. Thus if a slice is created in an xy plane, at some value of z, only $G_x$ and $G_y$ are required. In many cases a 3D set is required of a volume in the body. In that case a slab is selected representing the volume of interest. This is followed by a gradient set in all three axes which cover the desired range of k-space. Failure to select the slab can result in inadequate sampling or aliasing where portions of the image will overlap. The resultant signals, representing the spatial frequencies, are received by coil 16 and appear on terminal 17. They are then processed to create an image.

In U.S. Pat. No. 5,057,776 the gradients can be used to provide 3D imaging of the volume. For 2D imaging of a slice, the only slice selection methods shown require r.f. excitation. In this invention we show general methods of exciting one or more slices without requiring r.f. excitation.

Basically we make use of the fact that, as fields are changed adiabatically, the magnetic moments do not precess but continues to point in the direction of the net field. When they are changed non-adiabatically the field continues to point in the same direction as prior to the change and the moments will precess if there is a field component in quadrature with the moments. These properties are used in this invention to enable slice selection.

Figure 2:
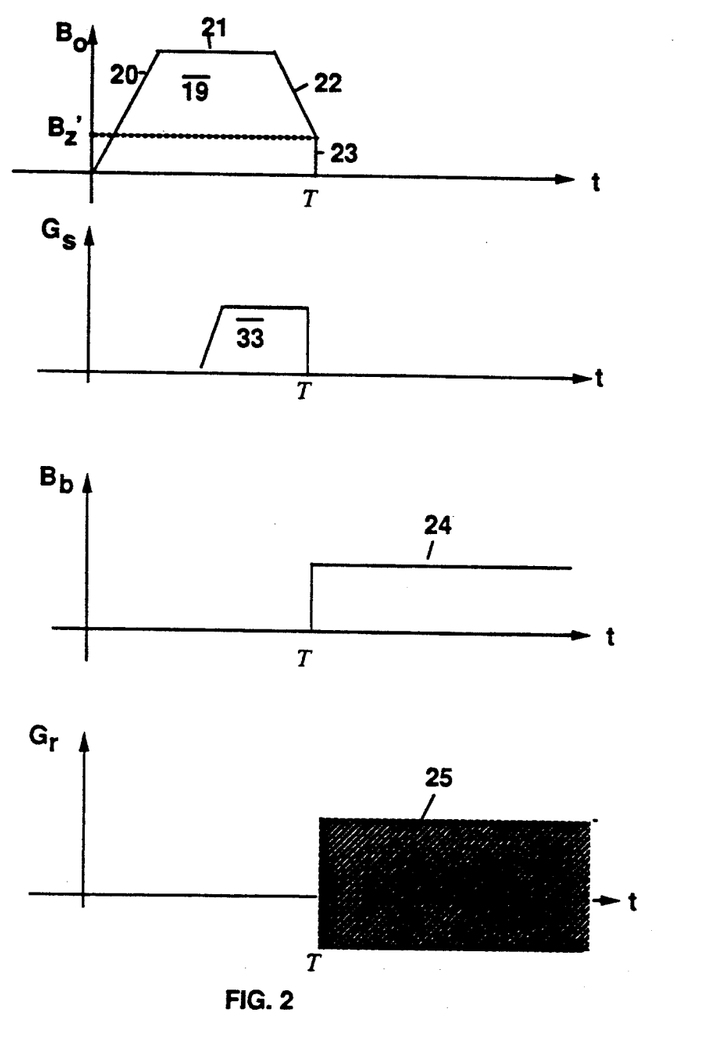
FIG. 2 is a set of graphs of signals used in an embodiment of the invention.

One embodiment is described using FIG. 2. The pulse 19, is applied to terminal 13 to provide the pulsed polarizing field. The ramp-up 20 is limited in slope by dB/dt considerations to avoid inducing neural currents in the body. The "on" period, 21, is determined by $T_1$ considerations for the materials involved. The ramp-down or collapse is the most significant consideration. The first part, 22, represents an adiabatic decrease where $dB/dt < < \gamma B^2$. During this period the magnetic moments will point in the direction of the field and not precess. Prior to the ramp-down, as shown, the selection gradient field $G_s$, represented by waveform 33, is turned on. The turn-on is adiabatic so as not to initiate precession.

Figure 4:
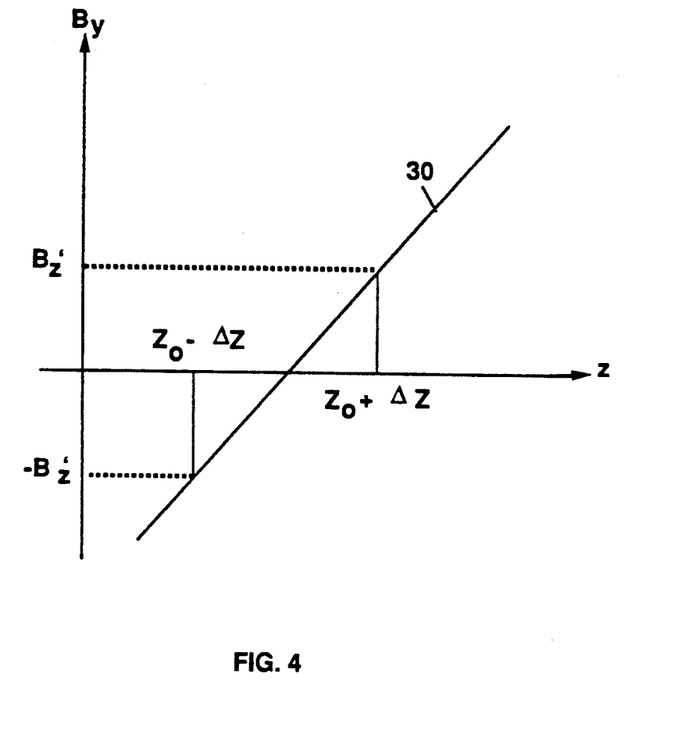
FIG. 4 is a plot of the selection gradient field.

The selection gradient field is shown graphically in FIG. 4 and uses gradient coils 12; the same ones used in the receiving mode. Basically the gradient coils 12 provide a By field which varies with x, y, or z, depending on the direction of slice desired. For illustrative purposes the gradient direction shown in FIG. 4 is z, although it could equally well be pointed in any other direction. As shown the gradient field 30 is zero, or has a null plane, at $z=z_0$. Thus moments at $z_0$ will be unaffected by this added field and those at other z planes will have a transverse magnetic field added to the longitudinal pulsed field. At the point where the gradient field is equal to the pulsed field $B_z'$, the amplitude of the magnetic moments in the z direction is down by 3 db. This may arbitrarily be defined as the slice width.

Returning to FIG. 2, we see that the pulsed field is adiabatically reduced to a value $B_z'$, in the presence of the transverse field from gradient $G_s$. Those moments at $z=z_0$ will be unaffected and continue to point in the z direction. However, those moments at planes well removed from $z_0$, where the transverse field $B_y$ is significantly greater than $B_z'$, will have their moments pointing in the y direction. We will thus have a distribution of pointing angles being primarily in the z direction around $z_0$ and primarily in the y direction well removed from $z_0$.

Figure 5:
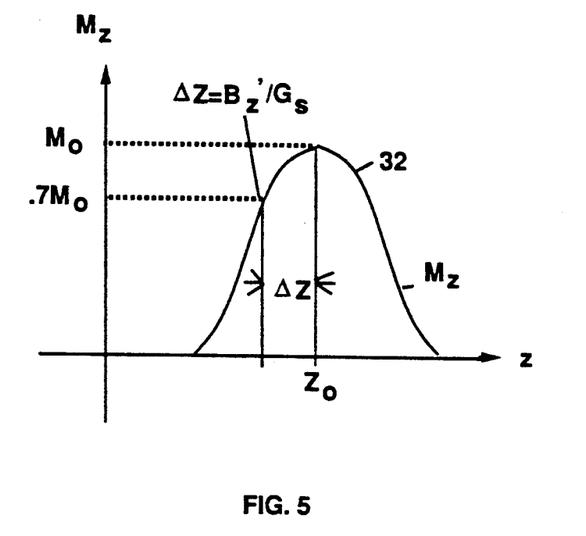
FIG. 5 is a plot of the precessing moment distribution in an embodiment of the invention.

At time T the pulsed field is collapsed at greater than the adiabatic rate where, in segment 23, $dB/dt > > \gamma B^2$. At the same time the selection gradient field 26 is turned off and the bias field 24 and gradient field 25 are turned on. Thus we have solely transverse fields in the y direction. These will cause any moment in the z direction to precess, since it is in quadrature. Thus the moments around $z_0$ will precess and provide signals while those well removed from $z_0$ will not precess since they are in the same direction as the transverse field. This provides the desired slice selection in the vicinity of $z_0$. The distribution of precessing spins is shown in FIG. 5 as graph 32. The amplitude of the Mz component, corresponding to the amplitude of precessing spins, is given by:

$$M_z = M_0 \frac{B_z'}{\sqrt{[B_z'^2 + (G_s \Delta z)^2]}}$$

As shown the 3 db or 71% point occurs at $\Delta z = B_z'G_s$. For z values far removed from the slice, the spin amplitude decreases as $1/\Delta z$.

Following slice selection the spin distribution of the selected slice is read out to provide an image. This can be done using bias field $B_b$, signal 24, to place the image information on a carrier, as described in U.S. Pat. No. 5,057,776. To scan k-space an array of readout gradients are used which vary on each excitation. To fill k-space we use the basic relationship:

$$k(t) \cdot r = \gamma \int G(t) \cdot r \, dt,$$

where k is the spatial frequency, r is the spatial dimension, G is the time-varying readout gradient signal and $\gamma$ is the gyromagnetic ratio.

Figure 3:
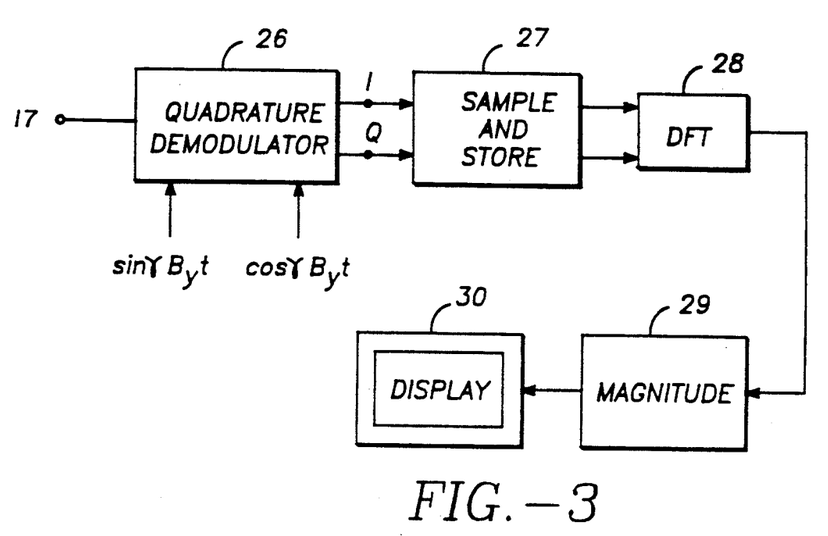
FIG. 3 is a block diagram of a signal processing embodiment of the invention.

A variety of imaging or readout gradient waveforms can be used as indicated in U.S. Pat. No. 5,057,776. The signals representing each k-space value are received using coil 16 and appear on terminal 17. The output signal 17 is processed as shown in FIG. 3. Here the signal is processed by quadrature demodulation at the bias frequency $\gamma B_b$ in demodulator 26. The in-phase and quadrature signals are sampled and stored in 27, and transformed in 28. The magnitude of the resultant transformed signal is found in 29 and displayed in 30.

As shown this is an effective mechanism for slice selection. It may be particularly effective for "slab" selection for 3D studies where the volume of interest is selected to avoid aliasing. If an inadequate number of samples are taken in k-space, the imaged volume can overlap with other parts of the volume. To avoid this, without requiring excess sampling, we excite only the portion of the volume of interest by the method described. For those applications where a very sharp slice is desired, as in multi-slice imaging, the embodiment in FIG. 6 may be preferable. Here a new gradient system is required, as compared to the previous embodiment which used gradient coils 12, the same set used for the receiving operation. Gradient system 18 is added which is identical to that of 12 but has the field pointing in the same direction as the pulsed field. The same sets of coils can be used to provide gradients in any direction. Alternatively, if slice selection is only desired in one or two directions, a limited set of coils can be used.

Figure 6:
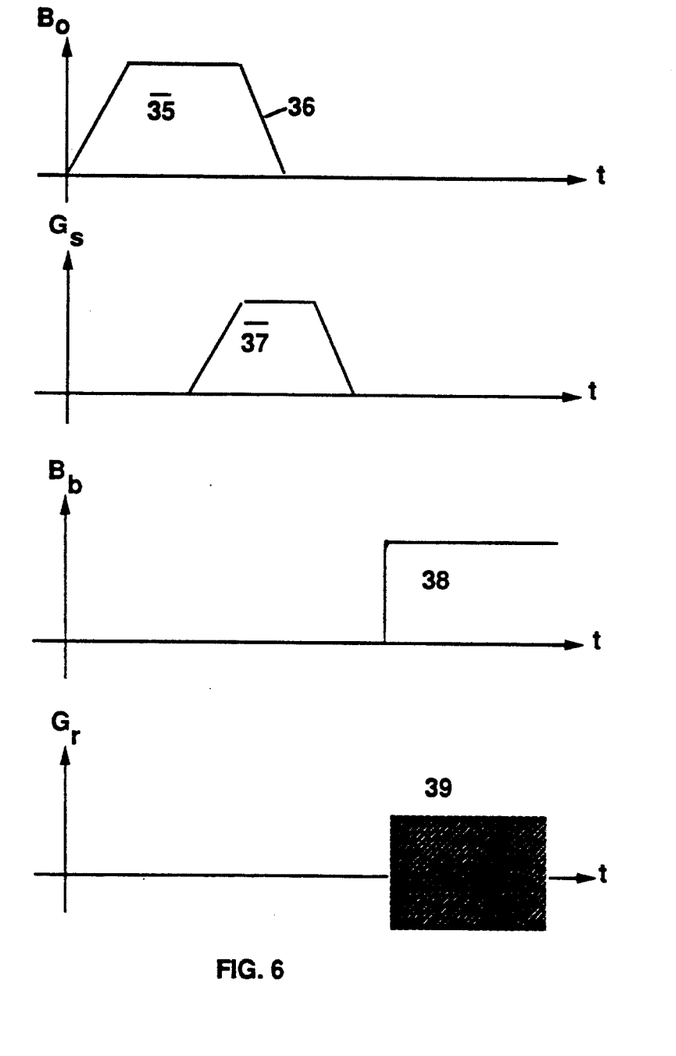
FIG. 6 is a set of graphs of signals used in an alternate embodiment of the invention.
Figure 7:
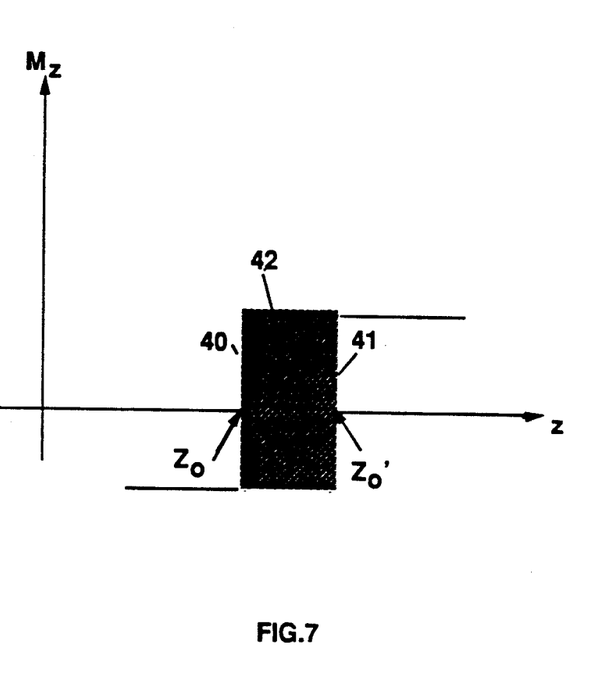
FIG. 7 is a plot of the precessing moment distribution in the alternate embodiment of the invention.

The polarizing pulse 35 is essentially the same as that of 19 except it continues its adiabatic decline to zero. The gradient selection field 37 in coils 18 is turned on prior to the collapse of the pulsed field and turned off adiabatically after the field 35 has collapsed. The gradient field $G_s$ is identical to that shown in FIG. 4, providing a null field at $z=z_0$. Note that this leaves the magnetic moments on either side of $z_0$ facing in opposite directions since, as previously indicated, during adiabatic variations the moments follow the field direction. We are thus left with a distribution shown in the solid line 40 in FIG. 7. When the image of the volume is then recorded, it corresponds to a projection in the z direction, with the image in the xy plane weighted as shown in 40. The entire imaging is then repeated with gradient $G_s$ changed with a null field at $z_0'$. The difference between these two acquisitions forms the final image, representing a sharp slice in the cross-hatch labeled 42.

For a multislice acquisition n acquisitions can be taken to form $n-1$ images. Different slice widths can be obtained by subtracting different acquisitions. This can be used to increase the signal-to-noise-ratio at the expense of resolution in the slice-select direction.

Both slice-selecting embodiments are quite robust and retain their properties with variations in the various parameters. For the embodiment of FIG. 2 the slice center is determined completely by the $G_s$ gradient null plane. The width of the slab will vary somewhat with the $B_z'$ of the pulsed field which is a negligible effect.

For the embodiment of FIG. 6, the slices depend solely on the gradient $G_s$ and are independent of all other parameters. If there is an extraneous transverse field, such as the earth's field, it can slightly effect the edge of the slice by causing magnetic moments immediately adjacent to the null plane to rotate, and therefore not precess when the $B_b$ bias and/or the readout gradients are turned on.

Although the descriptive material included a bias field, as explained in U.S. Pat. No. 5,057,776, a system needn't have a bias field and can operate with the readout gradient as the sole transverse field.

What is claimed:

1. In a method for selectively imaging the magnetic moments in a selected region of an object where the magnetic moments are polarized with a pulsed magnetic field which is turned off prior to the onset of an imaging sequence the steps of:
   applying a magnetic gradient field having a null field plane in the selected region prior to the collapse of the pulsed magnetic field; and
   controlling the resultant magnetic field such that the magnetic moments are spatially varying in the selected region of the object.

2. The method as described in claim 1 where the step of applying a magnetic gradient field includes the step of:
   applying a magnetic gradient field normal to the polarized magnetic moments prior to the collapse of the pulsed magnetic field; and the step of controlling the resultant magnetic field includes the step of
   controlling the rate resultant magnetic field such that the magnetic moments in the selected region of the object are excited and precess and those outside the selected region are not excited.

3. The method as described in claim 2 where the step of controlling the resultant magnetic field includes the step of reducing the amplitude of the pulsed magnetic field at an adiabatic rate until the field amplitude is comparable to the amplitude to the gradient field at edges of the selected region and then further reducing the amplitude at greater than the adiabatic rate whereby the moments outside the edges of the selected region will have rotated and those inside the selected region will precess.

4. The method as described in claim 2 including the step of applying an additional magnetic field in the same direction as the pulsed field prior to the collapsing of the pulsed field and where the step of controlling the resultant magnetic field includes the step of adiabatically reducing the field substantially to zero whereby the size of the selected region is substantially determined by the positions where the magnitude of the additional field equals that of the gradient field.

5. The method as described in claim 1 where the step of applying the gradient field includes the step of:
   a. applying a magnetic gradient field parallel to the polarized magnetic moments having the null field at a first plane; and the step of controlling the resultant magnetic field includes the step of:
   b. adiabatically collapsing the resultant magnetic field such that the magnetic moments on one side of the null plane are polarized in the direction of the pulsed field and those on the other side are polarized opposite to the pulsed field; and
   c. applying a set of imaging gradients normal to the polarized moments causing them to precess;
   d. receiving and storing a first set of imaging signals from the precessing moments;
   e. repeating steps a,b,c and d at a second null plane representing a second set of imaging signals; and
   subtracting the first and second imaging signals to selectively image the selected region between the two null planes.

6. The method as described in claim 5 including the step of further repeating steps a,b,c and d with different null planes whereby the number of sections imaged is one less than the number of excitations.

7. Apparatus for selectively imaging the magnetic moments in a selected region of an object where the magnetic moments are polarized with a pulsed magnetic field which is turned off prior to the onset of an imaging sequence comprising:
   means for applying a magnetic gradient field having a null field plane in the selected region prior to the onset of the imaging sequence; and
   means for controlling the resultant field such that the magnetic moments are spatially varying in the selected region of the object.

8. Apparatus as described in claim 7 where the magnetic gradient field is normal to the polarized magnetic moments prior to the collapse of the pulsed magnetic field; and the rate of collapse of the pulsed magnetic field is such that the magnetic moments in the selected region of the object are excited and precess and those outside the selected region are not excited.

9. Apparatus as described in claim 8 including means for reducing the pulsed magnetic field is at an adiabatic rate until the field amplitude is comparable to the amplitude of the gradient field at edges of the selected region and then further reducing the pulsed field at greater than the adiabatic rate whereby the moments outside the edges of the selected region will have rotated and those inside the selected region will precess.

10. Apparatus as described in claim 8 including means for applying an additional magnetic field in the same direction as the pulsed field prior to the collapsing of the pulsed field and means for adiabatically reducing the field substantially to zero whereby the size of the selected region is substantially determined by the positions where the magnitude of the additional field equals that of the gradient field.

11. Apparatus as described in claim 7 where the magnetic gradient field is parallel to the polarized magnetic moments and has a null field at a first plane; and further comprising:
   a. means for adiabatically collapsing the resultant magnetic field such that the magnetic moments on one side of the null plane are polarized in the direction of the pulsed field and those on the other side are polarized opposite to the pulsed field;
   b. means for applying a set of imaging gradients normal to the polarized moments causing time to precess;
   c. means for receiving and storing a first set of imaging signals from the precessing moments;
   d. means for repeating means a, b, and c at a second null plane representing a second set of imaging signals; and
   means for subtracting the first and second imaging signals to selectively image the selected region between the two null planes.

12. Apparatus as described in claim 11 including means for repeating the sequence with different null planes whereby n−1 sections are imaged using n excitations.

13. In a method for imaging magnetic moments in a selected region of an object having a gyromagnetic ratio $\gamma$ where the magnetic moments are polarized with a pulsed magnetic field which is turned off prior to the onset of an imaging sequence the steps of:

applying a magnetic gradient field having a null field in the selected region;

controlling the total magnetic field B so that it varies adiabatically as defined by $dB/dt << \gamma B^2$, whereby the magnetic moment distribution changes direction in the region of the null plane;

initiating precession of the magnetic moments to produce an imaging signal; and processing the image signal to image the magnetic moments in the selected region.

14. Apparatus for imaging magnetic moments in a selected region of an object having a gyromagnetic ratio $\gamma$ where the magnetic moments are polarized with a pulsed magnetic field which is turned off prior to the onset of an imaging sequence comprising:

a magnetic gradient field having a null field in the selected region;

means for controlling the total magnetic field B so that it varies adiabatically as defined by $dB/dt << \gamma B^2$, whereby the magnetic moment distribution changes direction in the region of the null plane;

means for initiating precession of the magnetic moments to produce an imaging signal; and means for processing the imaging signal to image the magnetic moments in the selected region.

* * * * *